United States Patent [19]

Puckett et al.

[11] Patent Number: 4,998,067

[45] Date of Patent: Mar. 5, 1991

[54] PORTABLE TEST APPARATUS FOR LOW CURRENT CIRCUIT BREAKERS

[76] Inventors: James D. Puckett, 2023 W. Claremont St., Phoenix, Ariz. 85061; Edward Weiss, 3610 W. Echo La., Phoenix, Ariz. 85051

[21] Appl. No.: 418,572

[22] Filed: Oct. 10, 1989

[51] Int. Cl.⁵ .............................................. G01R 31/32
[52] U.S. Cl. ...................................... 324/424; 340/638
[58] Field of Search ............... 324/424, 550, 503, 504, 324/114, 115; 340/638, 639, 644

[56] References Cited

U.S. PATENT DOCUMENTS

| | | | |
|---|---|---|---|
| 3,646,438 | 2/1972 | Staff | 324/503 |
| 3,663,939 | 5/1972 | Olsson | 324/504 |
| 4,105,965 | 8/1978 | Russell | 324/424 |
| 4,307,345 | 12/1981 | Schoen | 324/424 |
| 4,803,434 | 2/1989 | Walker | 324/424 |

FOREIGN PATENT DOCUMENTS 2844297  3/1980  Fed. Rep. of Germany ...... 324/424

Primary Examiner—Reinhard J. Eisenzopf
Assistant Examiner—Maura K. Regan
Attorney, Agent, or Firm—Joseph H. Roediger

[57] ABSTRACT

Portable testing apparatus for low current circuit breakers which enables short circuit and constant current tests to be conducted at the breaker panel. A first container includes a parallel array of resistive loads each under control of a corresponding relay. Low voltage control circuitry is provided in a second container and permits variation of the load appearing in series with the circuit breaker under test. The short circuit test can be performed at the first container which operates at the line voltage.

12 Claims, 2 Drawing Sheets

PORTABLE TEST APPARATUS FOR LOW CURRENT CIRCUIT BREAKERS

BACKGROUND OF THE INVENTION

This invention relates to portable testing apparatus for a circuit breaker and, in particular, to testing apparatus for use in testing residential circuit breaker panels.

Small business establishments and residences have their electric service brought to an external panel which contains a main circuit breaker and a number of individual low current circuit breakers. The breakers are rated by testing agencies to provide an open circuit under certain conditions. The primary circuit breaker that is actuated when the total current demand within the residence exceeds the rating will be actuated under limited circumstances. This circuit breaker is in series with a number of individual circuit breakers that define the current limitations of the individual circuits in the place of service. Most residential panels have 12 individual circuit breakers each rated at up to 60 amps.

The circuit breaker panels of residences are usually located on the exterior of the house at a point proximate to the distribution network of the utility. The placement is designed to shorten the distance to the distribution feeder and to provide a measure of safety in its location. Consequently, it is normally not proximate to the area of the residence that it controls. In order to conduct a test of an individual circuit breaker, it is heretofore common for an electrician to intentionally promote a short circuit within the dwelling and then make the trip out to the panel to determine which breaker was actuated. In the case where there is no immediate reaction to an intentional short circuit, it is frequently necessary to determine by a process of elimination which circuit breaker failed to open upon the creation of the intentional short within the dwelling. This is a time consuming and roundabout method of testing individual circuit breakers.

While the electrician servicing a small business establishment or residence can take the time to create short circuits at each of the circuits in the house, he may be duplicating his testing if he is not provided with a schematic at the time. However, a second test of breaker function is recommended and rarely, if ever, performed on low current breakers. This is the constant current test. Circuit breakers are designed to open when the amount of current remains constant on a particular circuit for a period of time. This constant load test is normally not performed in reviewing existing residential electric service.

The failure of an individual circuit breaker to open under short circuit conditions has serious consequences. In many residences and small business establishments, a master or primary circuit breaker is connected in series with the individual low current breakers to provide safety through redundancy. If an individual circuit breaker fails to open, it is quite likely that the high current flow will cause the master breaker, if present, to open promptly. However, the inability of the circuit breaker to maintain rated performance under overload conditions can be much more serious since the current flow through the electrical circuit served by this breaker may not exceed the rated current of the master breaker. In this case, the secondary breaker may not open at the appropriate current level. During the time that the individual circuit is experiencing this overload condition, the wires that form the circuit are drawing an abnormally large current and may be heating to an unsafe condition within a wall or otherwise out of view. Thus, the overlooking of the performance of a constant load test for individual circuit breakers is potentially hazardous.

The homeowners responsibility for the electric service begins at the electric meter provided by the utility. Consequently, the interest in the utility in providing apparatus for testing individual circuit breakers is limited with their attention being primarily directed to their own equipment. The manufacturers of apparatus used for transmission and distribution of electricity on a wholesale basis have expended substantial time and energy in providing a variety of different methods of automatically testing the operation of large capacity circuit breakers. This technology has not provided a relatively portable apparatus that is available for the electrician servicing the low current equipment at an individual residence.

Accordingly, the present invention is directed to the provision of a portable testing apparatus for circuit breakers. In particular, the apparatus is directed to the testing of circuit breakers used in residential and small business establishment panels. Further, the present invention is directed to the provision of a portable apparatus in which the operator can perform both a short circuit test and a constant load test.

SUMMARY OF THE INVENTION

The present invention is directed to a portable testing apparatus for circuit breakers which is designed for conducting short circuit and constant current tests at the breaker panel of a residential location. The apparatus includes a first container with a plurality of resistive load elements therein connected in a parallel array. A second plurality of relays each of which is connected to a particular load element is included in the array. When one or more of the relay means is activated, it varies the number of load elements in the array.

The load elements and relays are contained in a first container which includes external connections and a short circuit test receptacle. A first external connection is provided for the connection of the array in series with the circuit breaker under test. The second external connection includes a number of individual terminals which permit the use of a remote activating means included in a second container. In the second container is provided activating means for permitting independent control of each of the relays. The activating means operates at a relatively low voltage which is derived from a transformer provided in the first container. The transformer is removably coupled to the panel to receive the line voltage. By using the individual activating means in the second container, the load connected in series with the circuit breaker can be varied as desired by the operator. This permits the operator to perform a constant current test on the individual breaker being monitored at the breaker panel.

Also, the short circuit test receptacle included in the first container enables the operator to conduct a short circuit test for the circuit of the breaker being tested by intentionally creating a short at the receptacle. In the preferred embodiment of the invention, an insulated wire connection is made to the test receptacle with the free end of each wire having removable conductive rods attached thereto. By contacting the rods to each other, a short circuit test can be immediately performed on an individual breaker without leaving the area of the breaker panel. If the breaker opens, it has passed the test.

In the conducting of a constant load test, it is desirable to monitor both the voltage and current so that the operator can determine if the rated condition has been reached. Consequently, the containers can be provided with voltage and current indicating means for the operators direct observation.

The first external connection of the line voltage test circuitry in the first container enables the operator to make connection to the circuit breaker at the panel. This is accomplished by the use of electrical fast-on connector which attach to lugs on the breaker panel. The performance of the test at the site using the present invention eliminates uncertainty as to the identity of the breaker under test and permits direct observation of the performance of this circuit breaker. As a result, the operator does not have to move to different circuits throughout the residence to conduct the tests. Thus, the trial and error method of inducing shorts in individual circuits within the interior of the residence followed by trips to the breaker panel outside is eliminated.

Further features and advantages of the invention will become more readily apparent from the following detailed description thereof when taken in conjunction with the accompanying drawings.

DESCRIPTION OF THE PREFERRED EMBODIMENT

Figure 1:
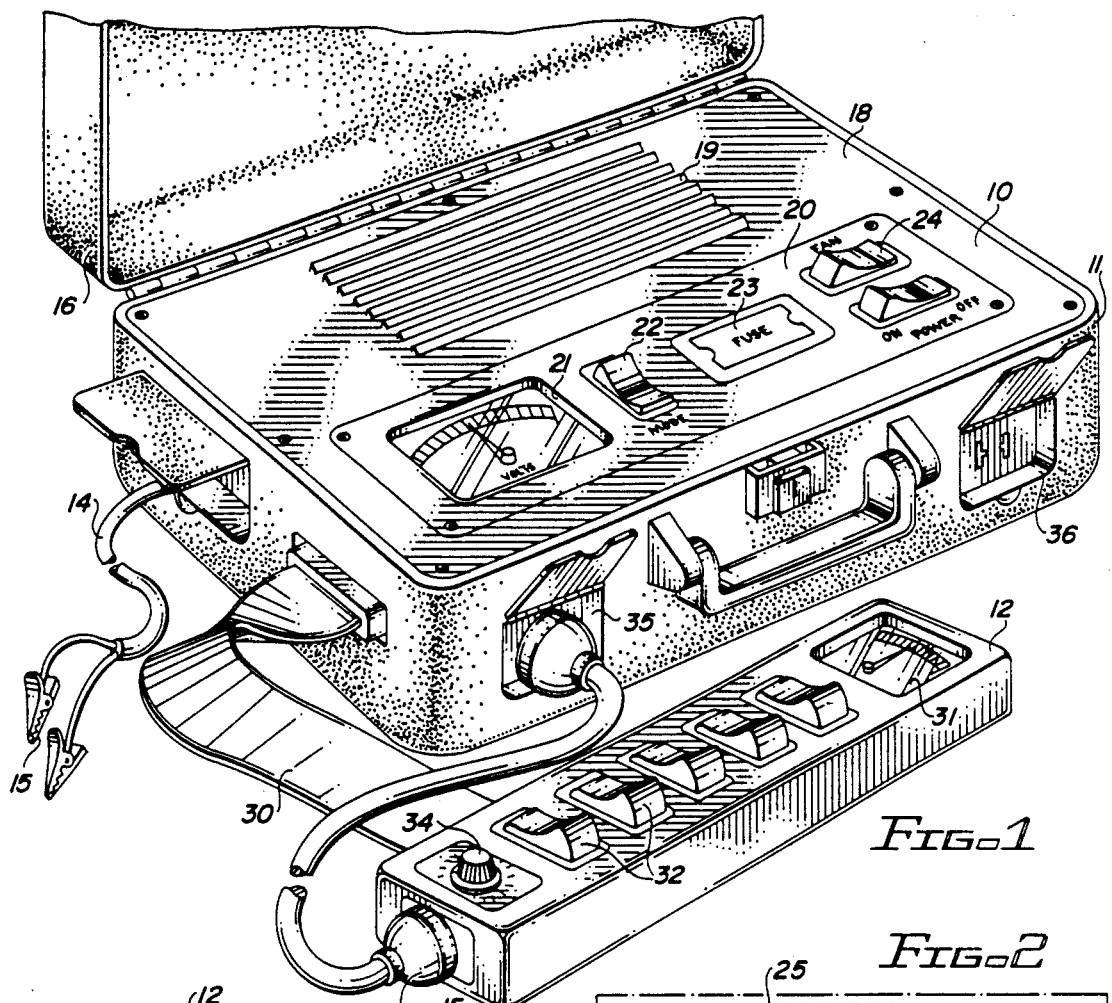
FIG. 1 is a view in perspective showing the first and second containers of the preferred embodiment.

Referring now to FIG. 1, the present invention is shown housed in a first and second containers 10 and 12. First container 10 has four electrical outlets located in its sidewalls. The smaller container 12 is electrically connected to the first container by a flexible strap connector 30 containing a plurality of individual conductors. The user of the portable apparatus for testing circuit breakers shown in FIG. 1 transports both containers to the circuit breaker panel containing the individual circuit breakers that are to undergo test. In a typical residence, the individual breakers are customarily in the 20 to 40 amp low rated current range.

As shown, first container 10 has a lower portion 11 with a hinged lid 16 affixed thereto. Face plate 18 defines the top surface of the lower portion 11 and is provided with mode, fan and power switches 22, 24 and 25 respectively. Also, voltmeter 21 is removably mounted in the face plate 18. A fuse receptacle 23 is provided for safety considerations and is accessible through the face plate 18. Louvers 19 provide air passages for the line voltage circuitry contained in the first container 10 and the fan 38 controlled by switch 24 promotes air circulation to remove heat from the electrical circuitry beneath the face plate.

The second container 12 includes low voltage control circuitry for the control of electrical elements within the first container. As shown, ammeter 31 is contained within the second container along with a plurality of switches 32 and a reostat 34. At the end of the second container is an external connection 33 which is coupled to external receptacle 35 on the first container by a length of conventional two wire cable. The line voltage is available at receptacle 35 and can be brought to the second connector via connection 33. Also, the flexible strap conductor 30 is brought to a corresponding connection having a plurality of pin connectors in the second container.

During normal use, the first and second containers 10, 12 are transported to the circuit breaker panel normally mounted on the outside wall of a residence. Then, the first container is connected in series with the individual low current circuit breaker under test. This is accomplished by the use of removable connectors 15 coupled through wire 14 to the first container when the primary or main circuit breaker is open. One removable connector 15 is connected to the output lug of the breaker under test and the other removable connector is connected to the panel ground. As a result, the circuitry within the first container is placed across or in electrical parallel with the circuit controlled by the circuit breaker under test. As will be later explained, the external receptacle 36 is utilized in combination with a short circuit test assembly when this type of test is to be conducted. It is the use of the mode switch 22 and the switches in the second container that enables a constant current test to be performed on the circuit breaker independently of the short circuit test.

Figure 2:
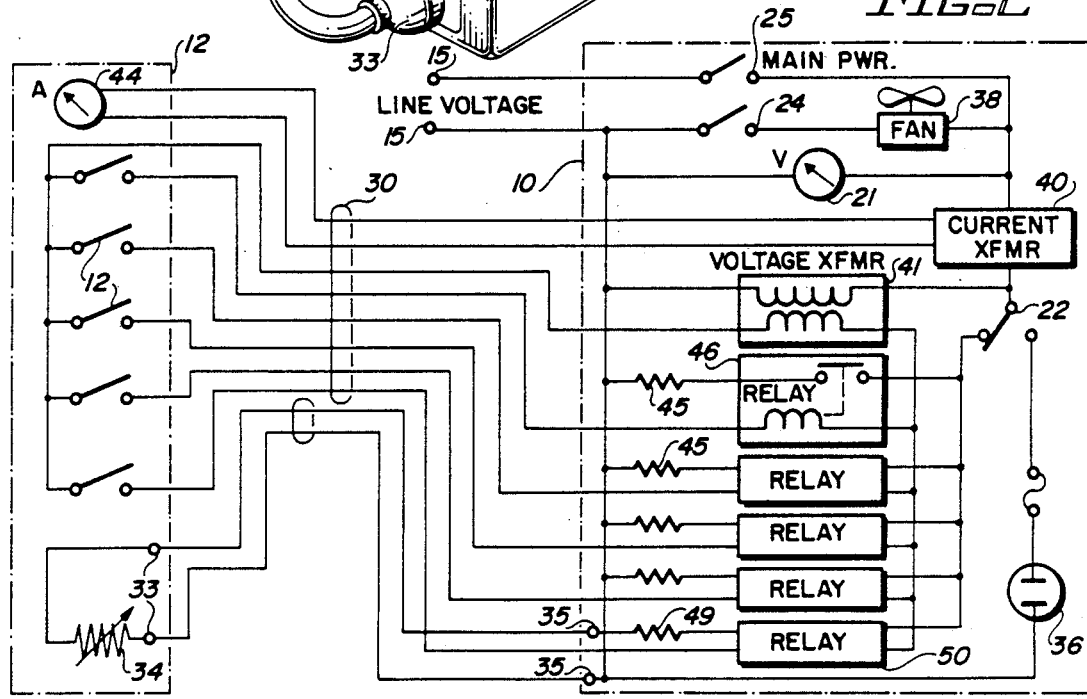
FIG. 2 is an electric schematic of the contents of the first and second containers of FIG. 1.

The contents of the first and second containers are shown in further detail in the electrical schematic diagram of FIG. 2. The large container 10 is shown provided with the first and second terminals which are labeled 15 to correspond to the connectors for attachment to the circuit breaker panel. Thus, line voltage is supplied to the first container and a main power switch 25 for the testing apparatus is connected in series with one of the connectors. As shown, fan 38 is included beneath the face plate 18 of the first container and promotes air flow in and about the electrical components within the container when the fan switch 24 is closed. A voltmeter 21 is connected between the two terminals 15 to indicate the voltage at which the testing is taking place. Current transformer 40 is connected as shown within the first container to provide a remote current indicator 44 located in the hand-held second container. Also, a voltage transformer 41 is connected between the external terminals 15 to receive the line voltage across its primary coil. The secondary coil of the voltage transformer is electrically connected through the strap connector 30 to the second container.

A plurality of resistive loads 45, each of which is in combination with a relay 46, are connected in a parallel array and contained in the first container 10. The line voltage appears across each resistive load element 45 when its corresponding relay has been activated. With the mode switch 22 in the position as shown, the number of resistive elements in the parallel array appearing between the first and second terminals can be varied by controlling selected ones of the relays. Consequently, the effective resistance appearing between the terminals 15 can be readily varied.

The control means for the individual relays is provided by switches 32 located in the second container. Each of these switches is coupled between the secondary coil of the voltage transformer and back to the relay via strap connector 30. In addition, one resistive load in the array is comprised of resistive element 49 in the first container and a variable resistor 34 located in the second container and connected in series therewith. This series connection is provided by a two wire connector between receptacles 33 and 35 of the containers. Relay 50, similar to relays 46, controls whether or not the combination of elements 49 and 34 are included in the array while variation of reostat 34 permits the magnitude of the resistive load to be varied in a controlled manner.

The mode switch 22 shown on the face plate 18 of the first container and in the electrical schematic can be moved to the short circuit test position wherein all the resistive elements 45 and 49 are removed from the circuit. As shown in FIG. 2, receptacle 36 is connected between the external terminals 15. It is with this receptacle that the short circuit test is conducted. The placement of the mode switch 22 in the position shown permits the operator to conduct a constant current test through the use of switches 32 and reostat 34 to provide a current of a given magnitude. The operator can select this current in accordance with the rating of the circuit breaker under test. By changing the position of the mode switch, the constant current circuitry is removed from operation and the short circuit test receptacle 36 can be utilized.

Figure 3:
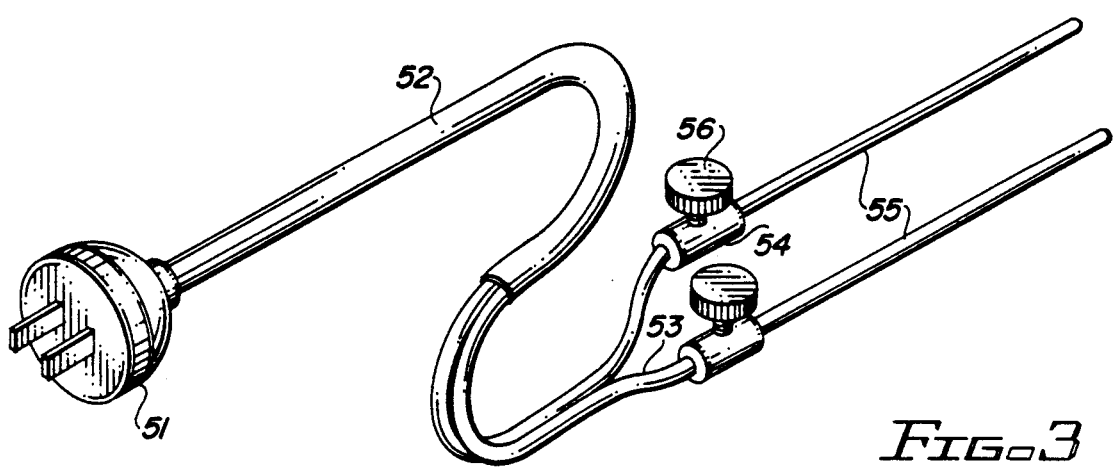
FIG. 3 is a view in perspective showing the short circuit test apparatus used in the preferred embodiment of FIG. 1.

In the preferred embodiment of the invention, the short circuit test apparatus shown in FIG. 3 is utilized. The two pronged plug 51 is inserted in the short circuit test receptacle 36 of the first container. A two wire flexible conductor 52 is shown with the individual insulated wires 53 extending therefrom. Each of these wires is provided with a sleeve 54 that removably receives an exposed solid copper rod 55. A set screw 56 is provided for replacement of the rods if they become fitted or consumed during repeated testing. The changing of the rods takes place when the connector 51 is removed from receptacle 36. While the short circuit test apparatus in FIG. 3 is preferred for use in connection with the present invention, it is recognized that other test assemblies can be used if desired.

During operation, the clips 15 are positioned so that the circuitry of the first container is in series with the circuit breaker under test. This is done with the primary breaker of the panel in the open position and the power switch 25 in the off position as shown. After connection of the clips 15, the primary breaker is then placed in the closed position and the operator is prepared to conduct one or both tests on the circuit breaker. The schematic of FIG. 2 shows the mode switch 22 in position to conduct a constant current test. The operator conducting the circuit breaker test knows the rating of the breaker and may preset switches 32 to approximate the current rating for the constant current test. Adjustment of the current to bring it the last increment to the rated level is accomplished by control of relay 50 and variation of reostat 34 while observing the current indicated in ammeter 44. The operator maintains the current level for a period of time in accordance with the stated rating of the breaker and observes whether the breaker trips. For example, industry acceptability for installed circuit breakers subjected to twice rated current requires that the breaker operate within 60 to 90 seconds of the current assuming the twice-rated value. If it should fail to trip within the recommended period of time, the breaker has failed its test and should be replaced. As a check on the test, the operator has available to him the line voltage which is displayed at voltmeter 21 of the first container.

By changing the position of mode switch 22, the constant current test is terminated and the apparatus is ready for the conducting of a short circuit load test. The short circuit is created at receptacle 36 and the performance of the breaker monitored. If the breaker has not tripped, it is clearly in need of replacement. The short circuit test can be conducted by the use of receptacle 36 in combination with the short circuit test apparatus of FIG. 3 wherein the operator brings rods 55 into mutual contact. The circuit breaker under test should trip immediately. The fuse 23 is provided in the event that the circuit breaker is defective and fails to open the circuit.

The entire testing sequence is performed at the breaker panel and no need exists for the operator to enter the residence. Furthermore, positive identification of the breaker under test is made thus eliminating the need for repeated trips between circuits within the residence and the breaker panel. Thus, the testing procedure is greatly accelerated as well as being expanded to include both short circuit and constant current tests. The data generated by use of the present invention can be directed to a remote printer by sensing means used in the transformer circuit. The elapsed time required for a breaker to open would be determined by a digital counter in the remote printer and recorded on a printed card. Furthermore, the switches in the second container need not be manual in other embodiments but can be controlled by a preprogrammed keypad assembly which controls the switch activation in accordance with the current level entered therein.

While the above description has referred to a specific embodiment of the present invention, it is to be noted that many modifications and variations may be made therein without departing from the scope of the invention as claimed.

What I claim is:

1. Portable testing apparatus for a circuit breaker which comprises:
   (a) a first container for receiving line voltage test circuitry, said container having first and second external connections and a short circuit test receptacle, the first external connection having first and second terminals for connection in series with the circuit breaker under test and the second external connection including a number of individual terminals, said first container including:
      i. a plurality of resistive elements removably coupled in a parallel array between said first and second terminals;
      ii. a plurality of relay means for decoupling individual resistive elements from said array when a corresponding one of said relay means is activated, said relay means being coupled to the second external connection of said container;
      iii. transformer means coupled between said first and second terminals for providing a low voltage output signal at said second external connection;
      iv. means for coupling said short circuit test receptacle between said first and second terminals;
   (b) a second container for low voltage control circuitry, said container including a low voltage input terminal and a number of individual terminals for coupling to the second external connection of the first container, said second container including:
      i. a plurality of switches each connected to a corresponding terminal of said second container and to the low voltage terminal, each of said switches controlling one of said relay means to decouple the corresponding resistive means from the array and thereby control the load between said first and second terminals of the first container to provide an overload test of said circuit breaker, and (c) means for coupling the terminals of said second container to said second external connection.

2. The invention in accordance with claim 1 further comprising:

(a) variable resistive means included in said second container; and (b) means for coupling said variable resistive means in series with one of said plurality of resistive elements to permit a controlled increase in load during the overload test.

3. The invention in accordance with claim 2 wherein said second container further comprises current indicating means for showing current flows in said array.

4. The invention in accordance with claim 3 wherein said first container further comprises voltage indicating means for showing voltage between the first and second terminals.

5. The invention in accordance with claim 4 wherein said first container further comprises fuse means connected in series with said test receptacle.

6. The invention in accordance with claim 5 wherein said first container further includes cooling means for removing heat generated by current flow through said array.

7. The invention in accordance with claim 5 wherein said first container further comprises a mode switch connected between one of said terminals and of said array.

8. The invention in accordance with claim 5 further comprising:

(a) first and second hand-grippable insulating wires for connection to said test receptacle, each wire having a free end;

(b) first and second conductive rods attached to the free end of one of said wires, the contact of said rods providing a short circuit test of said breaker.

9. The invention in accordance with claim 8 further comprising coupling means affixed to said free ends for removably supporting said conductive rods.

10. Apparatus for conducting short circuit and constant current tests on a circuit breaker, said apparatus comprising:

(a) a first plurality of load elements connected in a parallel array, said array having first and second terminals;

(b) a second plurality of relays, each of said relays being connected to one of said load elements;

(c) remote activating means for independently controlling each of the second plurality of relays;

(d) means for removably coupling the array of load elements in series with the circuit breaker, said remote activating means controlling the magnitude of the electrical load in series with the circuit breaker;

(e) a short circuit test receptacle connected in parallel with said array between said first and second terminals, and (f) switch means connected between the circuit breaker and the parallel combination of array and receptacle to permit test selection.

11. The invention in accordance with claim 10 wherein at least one of said load elements is variable.

12. The invention in accordance with claim 11 further comprising short circuit test means for placement in said receptacle and establishing a short circuit, said means including first and second replaceable conductive rods.

* * * * *